United States Patent [19]

Hales

[11] Patent Number: 5,150,085
[45] Date of Patent: Sep. 22, 1992

[54] ELECTRONICALLY TUNABLE FRONT END FILTER FOR RADIO APPARATUS

[75] Inventor: Jeffrey E. Hales, Keyesborough, Australia

[73] Assignee: U.S. Philips Corporation, New York, N.Y.

[21] Appl. No.: 549,788

[22] Filed: Jul. 9, 1990

[30] Foreign Application Priority Data

Jul. 7, 1989 [AU] Australia ..................... 5119

[51] Int. Cl.⁵ .................. H03H 7/12; H01P 1/202
[52] U.S. Cl. .................. 333/174; 333/175; 333/207
[58] Field of Search ............... 333/174, 175, 176, 202, 333/207

[56] References Cited

U.S. PATENT DOCUMENTS

| | | | |
|---|---|---|---|
| 3,110,004 | 11/1963 | Pope | 333/175 X |
| 3,889,214 | 6/1975 | Petitjean et al. | 333/202 X |
| 4,714,906 | 12/1987 | D'Albaret et al. | 333/202 |
| 4,721,932 | 1/1988 | West | 333/207 |
| 4,839,617 | 6/1989 | Speake | 333/174 |
| 5,028,894 | 7/1991 | Speake | 333/175 X |

FOREIGN PATENT DOCUMENTS

| | | | |
|---|---|---|---|
| 142103 | 6/1935 | Fed. Rep. of Germany | 333/174 |
| 1063218 | 8/1959 | Fed. Rep. of Germany | 333/175 |
| 2059887 | 6/1972 | Fed. Rep. of Germany | 333/168 |

Primary Examiner—Eugene R. LaRoche
Assistant Examiner—Benny Lee
Attorney, Agent, or Firm—David R. Treacy

[57] ABSTRACT

A multi-pole filter for use in radio apparatus includes a plurality of isolated ceramic resonators each having an associated varicap diode network to enable electronic tuning respective of ceramic resonators. The inputs of adjacent ceramic resonators are coupled via a first coupling path and also via a second coupling path, the first coupling path being composed of a fixed capacitance network and the second coupling path being composed of a capacitance network including the varicap diode networks associated with the adjacent resonators. The selective values of the various capacitances forming the first and second coupling paths are such that the overall coupling between the resonators remains substantially constant during the electronic tuning of the resonators by the varicap diode network.

8 Claims, 2 Drawing Sheets

ELECTRONICALLY TUNABLE FRONT END FILTER FOR RADIO APPARATUS

BACKGROUND OF THE INVENTION

1. Field of the Invention

The present invention relates to a filter for use in radio apparatus, the filter comprising a plurality of resonators and plurality of variable capacitance means for electronically tuning respective resonators. The invention also relates to a radio apparatus comprising such a filter.

2. Description of the Related Art

Such a filter is known and is used in the front end of the Philips FM1000 mobile radio receiver. This filter comprises a plurality of resonators of the parallel LC type wherein the coupling between adjacent resonators is achieved by capacitive circuit elements rather than by electromagnetic coupling between the resonators themselves. These resonators have a high impedance and the capacitance of the variable capacitance means need only be a relatively small value to tune the resonators which does not seriously affect the performance of this filter. However these resonators have the disadvantage of being large and do not lend themselves to mass production. Furthermore the resonators in this filter have the further disadvantage of requiring shields and also requiring an isolated board for the high voltage end of the resonators.

Front end filters are of two general types, namely broad band fixed frequency filters and narrow band tunable filters which can be mechanically or electronically tuned the latter of which the FM1000 front end filter is an example. These narrow band tunable filters are more suitable for use in areas where there are a large number of transmitters and receivers and interference is a problem. In recent years it has been known to use bonded pairs or triplets of ceramic resonators in broad band fixed frequency filters where the coupling between the ceramic resonators is obtained purely by electromagnetic coupling and not by circuit elements. A filter is proposed consisting of a plurality of isolated ceramic resonators coupled via externally connected circuit elements. Isolated ceramic resonators have a low impedance and require a relatively large capacitive loading for electronic tuning. When these resonators are configured in the proposed filter and are electronically tuned, the coupling between adjacent resonators becomes difficult to control, in that the coupling co-efficient varies over the tuning range and the losses introduced by the tuning capacitance degrades the effective resonator Q.

SUMMARY OF THE INVENTION

It is the object of the invention to utilize ceramic resonators in tunable filters and minimize the disadvantages regarding their use in such filters.

According to the invention, a filter for use in radio apparatus comprises a plurality of isolated ceramic resonators each having associated therewith and coupled to an input thereof a variable capacitance for electronically tuning the associated ceramic resonator. The inputs of adjacent ceramic resonators are coupled via a first signal coupling path comprising a fixed capacitance, and also via a second signal coupling path in parallel with the first signal coupling path, for coupling signals from one of the adjacent resonator inputs to the other. The second path comprises at least a cascade arrangement of the variable capacitance means associated with one of the adjacent resonators and the variable capacitance means associated with the other of the adjacent resonators, the relative values of the capacitances included in the first and second coupling paths being such that the overall coupling between the resonators remains substantially constant during the electronic tuning of the resonators by their associated variable capacitance means. Therefore the insertion loss of the filter will remain substantially constant and the performance of the filter will not be seriously degraded. Moreover ceramic resonators are relatively small and lend themselves to mass production. Furthermore the filter avoids the use of shields, and does not require an isolated board.

In a preferred embodiment of the invention the second coupling path comprises a coupling capacitance which is common to both the variable capacitance means associated with one of the adjacent resonators and the variable capacitance associated with the other of the adjacent resonators. This coupling capacitance will assist in the enhancing of the coupling at the low frequency end of the tuning range so as to provide constant coupling over the tuning range.

In a further preferred embodiment of the invention each variable capacitance means comprises in series a varicap diode network and an associated capacitance, wherein the coupling capacitance is coupled to the junction between the varicap diode network and the associated capacitance.

BRIEF DESCRIPTION OF THE DRAWINGS

Embodiments of the invention will be described in more detail, by way of non-limitative example with reference to the accompanying drawings, wherein

FIG. 2b is a cross-section of the ceramic resonator of FIG. 2a.

DETAILED DESCRIPTION OF THE PREFERRED EMBODIMENT

Figure 1A:
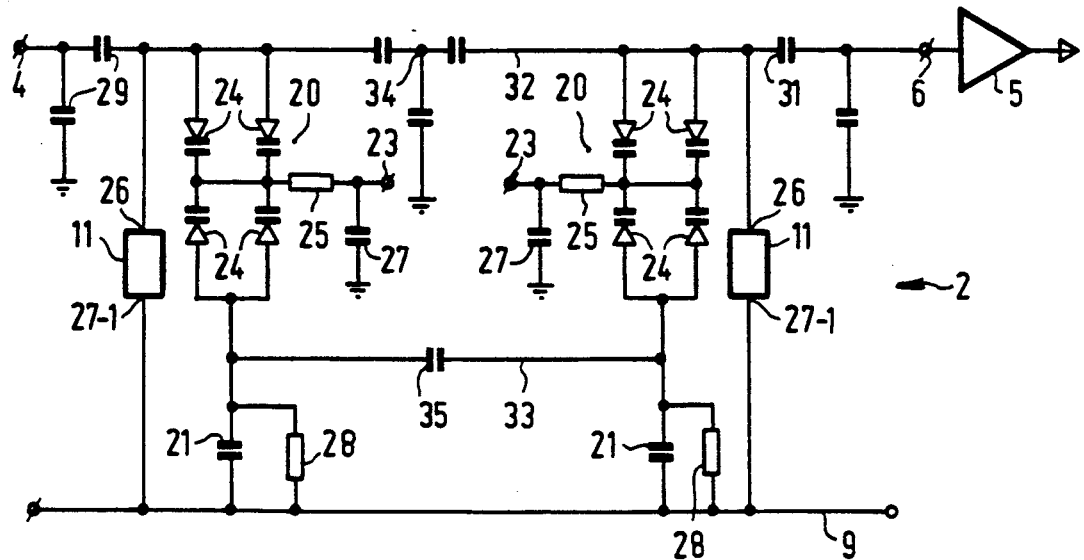
FIGS. 1a and 1b are electrical schematic diagrams showing section of a filter in accordance with the invention.
Figure 1B:
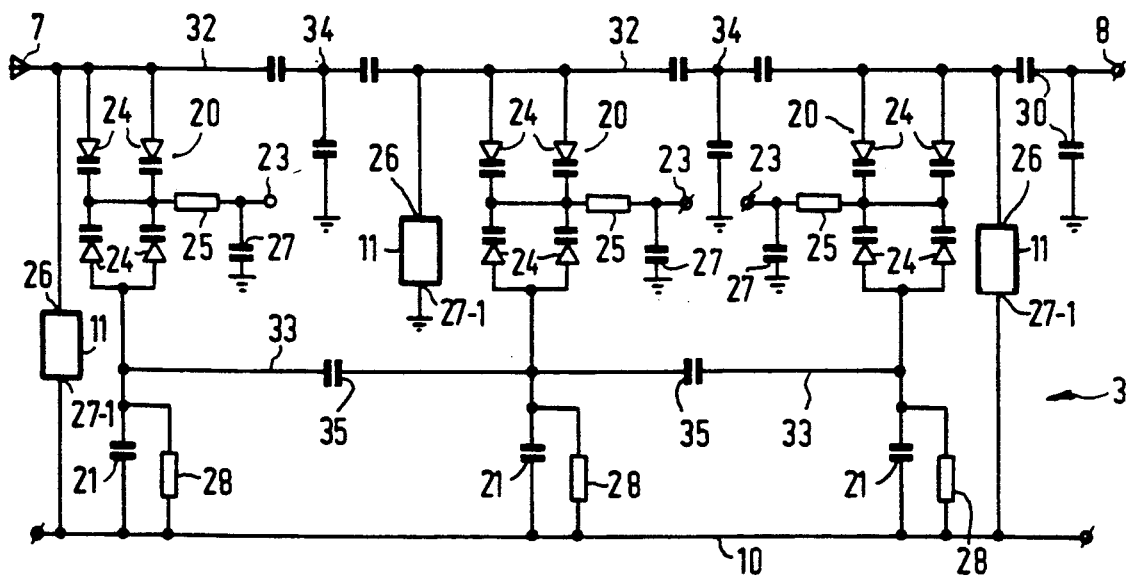

FIGS. 1a and 1b depict a narrow band electronically tunable filter that is suitable for use in the front end of a UHF radio receiver. The filter consists of a two pole filter section 2 (showing in FIG. 1a) and a three pole filter section 3 (shown in FIG. 1b) coupled thereto via a RF amplifier 5. For the sake of simplicity the coupling between the two pole and three pole filter sections is not shown, however in this embodiment the output 6 of the two pole filter section is coupled to the RF amplifier 5, the output of which is coupled to the input 7 of the three pole filter 3, both lines 9 and 10 being short circuited to ground. The received RF signal is supplied to the two pole filter section 2 via input 4 of the filter and the output signal of the filter is supplied on output 8 of the three pole filter section 3. Whilst this preferred embodiment is limited to a two pole filter section in combination with a three pole section, the invention is not limited to a filter having a specific number of poles. Other multi-pole filters in accordance with the invention are envisaged having a similar ladder network to the embodiment depicted by FIGS. 1a and 1b.

Figure 2A:
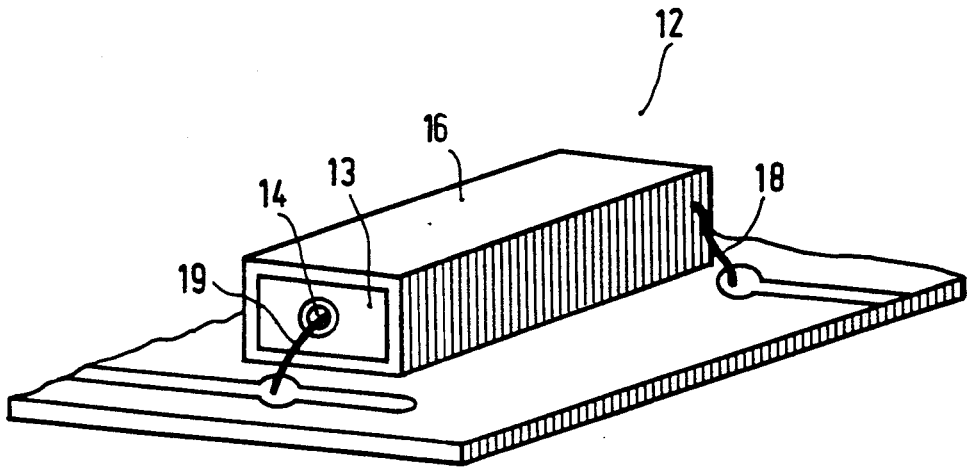
FIG. 2a is a view of a ceramic resonator used in the embodiment shown in FIGS. 1a and 1b.
Figure 2B:
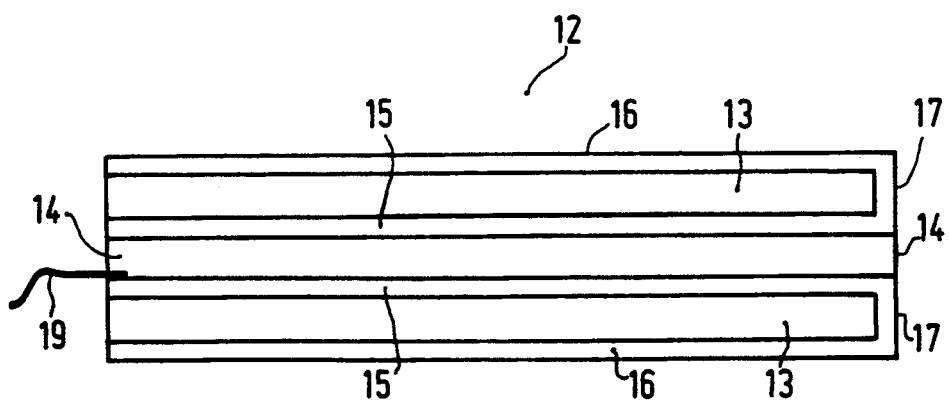

The two pole and three pole filters sections 2, 3 in FIGS. 1a and 1b respectively have a number of ceramic resonators 11 each of which have a high dielectric constant of the order of 93, an unloaded Q of typically 400 and a low impedance of the order of 6 Ohms. A ceramic resonator 12 of the kind used in the filter sections 2 and 3 is depicted in FIGS. 2a and 2b. The ceramic resonator 12 is electrically equivalent to a quarter wavelength transmission line terminated in a short circuited end. The ceramic resonator 12 comprises a rectangular block 13 of high dielectric material having an aperture 14 passing longitudinally therethrough, the dielectric block 13 being metalized on the outside of the block and on the inside of the aperture thereby creating the transmission line. The inner 15 and outer 16 metallization are joined at one end 17 thereby short circuiting the transmission line (see FIG. 2b), the input 26 (FIGS. 1a and 1b) of each one of the resonators being provided by a conductor 19 coupled to the inner metallization (FIGS. 2a and 2b). The shorted end 27-1 (FIGS. 1a and 1b) is provided by a conductor 18 (FIG. 2a) coupled to the outer metallization at the end 17.

In the embodiment depicted in FIGS. 1a and 1b, ceramic resonators 11 are chosen to have a natural resonant frequency of typically 50 MHz higher than the highest frequency in the desired tuning range. The input 26 of each ceramic resonator 11 is end loaded by means of the series combination of a varicap diode network 20 and an associated capacitance 21 extending between the input 26 and ground via lines 9 and 10, the shorted end 27-1 of the resonators being coupled to ground via lines 9 and 10. The total capacitance across each resonator 11, provided by the varicap diode network 20, its associated capacitance 21, the coupling capacitance 35 and other end loaded capacitances, are chosen whereby the natural frequency of the resonator 11 will be lowered to within the desired tuning range. The capacitance of the varicap diode networks 20 are varied by supplying an appropriate bias voltage on the DC supply input 23 whereby the resonators are able to be electronically tuned to a selected frequency within the desired tuning range. The varicap diode networks 20 each comprise a group of four varicap diodes 24 arranged in opposed pairs of parallel connected varicap diodes. Such a configuration of varicap diodes 24 is preferable to using only one varicap diode since a reduction of intermodulation distortion is achieved without adding any extra loss.

Coupled between the DC bias voltage input 23 and the varicap diode network 20 is a relatively high series resistance 25 and a bypass capacitance 27. The resistance 25 isolates the low impedance of the DC bias supply from loading the resonators, and the bypass capacitance 27 prevents any RF signals from being supplied to the DC bias supply. A relatively high resistance 28 is coupled across the associated capacitance 21 and provides a DC return for the bias current of the varicap diode network 20. The resistance 28 has a negligible shunting effect on the resonator and does not noticeably affect filter performance.

The signal on the output of the two pole filter section 2 is fed via the RF amplifier 5 so that the S/N ratio of the signal does not significantly deteriorate beyond the amplifier. In other preferred embodiments the RF amplifier may be omitted. The filter is also provided with an input matching capacitance network 29, a output matching capacitance network 30 and RF amplifier matching capacitance network 31.

Coupling between adjacent resonators occurs via a first coupling path 32 and a second coupling path 33. The first coupling path 32 comprises fixed capacitance 34 in the form of a T-network and the second coupling path 33 comprises the varicap diode networks 20 of their respective resonators 11 together with their associated series capacitances 21 and a coupling capacitance 35. The fixed capacitance 34 may in other embodiments be replaced by a single capacitance or another network capacitance. Similarly the coupling capacitance 35 may be replaced by a network capacitance.

In operation, the first coupling path 32 provides satisfactory coupling at the high frequency end of the tuning range which is not adequate for the low frequency end of the tuning range whereas the second coupling path 33 enhances coupling at the low frequency end. This arrangement maintains filter insertion loss essentially constant over the filter tuning range.

The relevant values of the coupling capacitances comprising the first coupling path 32 and second coupling path 33 are determined from the coupling co-efficient for the desired bandwidth, insertion loss and response. As the capacitance of the varicap diode networks 20 across each resonator will change with tuning, the value of the coupling co-efficient will vary over the band. This is controlled by the second coupling path 33 which incorporates the varicap diode networks 20 and coupling capacitance 35. The desired total coupling capacitance at each end of the tuning range is calculated and the difference between the desired capacitance at the low frequency end and the coupling capacitance due to the first coupling path at the low frequency end, is constructed from the second coupling path. The total reactance from the coupling network forms part of the overall resonator loading. The filter input and output matching capacitance as well as the RF matching capacitance are also part of the overall summation and are chosen to be small as possible to maximise the available tuning range.

There may be a tendency for there to be a variation in insertion loss even though the coupling remains constant because of the losses introduced by the varicap diodes. This may be overcome by deliberately increasing the filter coupling co-efficient at the low frequency end. However, this increases bandwidth and the image rejection specifications may not be met. The actual filter coupling co-efficient can be chosen so as to minimize insertion loss with acceptable image rejection.

As will be apparent from the foregoing, various modifications and/or additions and/or subtractions to the above embodiments are possible without departing from the scope of the invention.

I claim:

1. In a radio apparatus, a front-end filter comprising a plurality of isolated ceramic resonators each having a respective input, and a corresponding plurality of variable capacitance means, each variable capacitance means being coupled to the input of a respective associated ceramic resonator for electronic tuning over a range of frequency, wherein the inputs of two adjacent ceramic resonators are coupled through a first signal coupling path, and through a second signal coupling path in parallel with said first signal coupling path, for coupling signals from one of the adjacent resonators to the other of the adjacent resonators, the first signal coupling path consists of fixed capacitance means, and the second signal coupling path comprises at least a cascade arrangement of the entire variable capacitance means associated with one of the adjacent resonators and the entire variable capacitance means associated with the other of the adjacent resonators.

2. A front-end filter as claimed in claim 1 comprising a common coupling capacitance which forms part of said variable capacitance means associated with one of the adjacent resonators, and forms part of said variable capacitance means associated with the other of the adjacent resonators, said common coupling capacitance forming part of said second coupling path.

3. A front-end filter as claimed in claim 2, wherein each variable capacitance means comprises a respective varicap diode network in series with a respective associated capacitance, and said coupling capacitance is coupled between a junction between the varicap diode network and associated capacitance associated with said one of the adjacent resonators, and a junction between the varicap diode network and the associated capacitance of the other of the adjacent resonators.

4. A front-end filter as claimed in claim 3, wherein said fixed capacitance means and said respective associated capacitances have values selected such that a coefficient of coupling of signals from said one of the adjacent resonators to said other of the adjacent resonators remains substantially constant over a range of frequency defined by electronic tuning of the resonator by the respective variable capacitance means.

5. A filter comprising a plurality of isolated ceramic resonators each having a respective input, and a corresponding plurality of variable capacitance means, each variable capacitance means being coupled to the input of a respective associated ceramic resonator for electronic tuning over a range of frequency, wherein the inputs of two adjacent ceramic resonators are coupled through a first signal coupling path, and through a second signal coupling path in parallel with said first signal coupling path, for coupling signals from one of the adjacent resonators to the other of the adjacent resonators, the first signal coupling path consists of fixed capacitance means, and the second signal coupling path comprises at least a cascade arrangement of the entire variable capacitance means associated with one of the adjacent resonators and the entire variable capacitance means associated with the other of the adjacent resonators.

6. A filter as claimed in claim 5, comprising a common coupling capacitance which forms part of said variable capacitance means associated with one of the adjacent resonators, and forms part of said variable capacitance means associated with the other of the adjacent resonators, said common coupling capacitance forming part of said second coupling path.

7. A filter as claimed in claim 6, wherein each variable capacitance means comprises a respective varicap diode network in series with a respective associated capacitance, and said coupling capacitance is coupled between a junction between the varicap diode network and associated capacitance associated with said one of the adjacent resonators, and a junction between the varicap diode network and the associated capacitance of the other of the adjacent resonators.

8. A filter as claimed in claim 7, wherein said fixed capacitance means and said respective associated capacitances have values selected such that a coefficient of coupling of signals from said one of the adjacent resonators to said other of the adjacent resonators remains substantially constant over a range of frequency defined by electronic tuning of the resonator by the respective variable capacitance means.

* * * * *